United States Patent [19]

Grung et al.

[11] Patent Number: 4,868,624
[45] Date of Patent: Sep. 19, 1989

[54] CHANNEL COLLECTOR TRANSISTOR

[75] Inventors: Bernard L. Grung, Minneapolis; Raymond M. Warner, Jr., Edina; Thomas E. Zipperian, St. Paul, all of Minn.

[73] Assignee: Regents of the University of Minnesota, Minneapolis, Minn.

[21] Appl. No.: 841,012

[22] Filed: Mar. 14, 1986

Related U.S. Application Data

[63] Continuation of Ser. No. 148,471, May 9, 1980, abandoned, which is a continuation of Ser. No. 799,530, May 23, 1977, abandoned.

[51] Int. Cl.$^4$ ............................................. H01L 29/72
[52] U.S. Cl. ...................................... 357/34; 357/13; 357/43; 357/20; 357/59
[58] Field of Search ........................ 357/43, 13, 34, 20, 357/59 H

[56] References Cited

U.S. PATENT DOCUMENTS

| | | | |
|---|---|---|---|
| 3,404,295 | 10/1968 | Warner, Jr. | 357/13 |
| 3,564,356 | 2/1971 | Wilson | 357/13 |
| 3,847,687 | 11/1974 | Davidsohn et al. | 357/59 |
| 4,003,072 | 1/1977 | Matsushita et al. | 357/13 |
| 4,006,046 | 2/1977 | Parekh | 357/34 |
| 4,086,610 | 4/1978 | Clark et al. | 357/13 |

OTHER PUBLICATIONS

Hamilton et al, Basic Integrated Circuit Engineering, McGraw-Hill, N.Y., 1975, pp. 21-24.

Sze, Physics of Semiconductor Devices, 1st Edition (Wiley, N.Y., 1969), p. 43.
Warner, Jr. and Grung, "A Bipolar Lock Layer Transistor", Solid-State Electronics, 18, 323 (1975).

Primary Examiner—Andrew J. James
Attorney, Agent, or Firm—Merchant, Gould, Smith, Edell, Welter & Schmidt

[57] ABSTRACT

A monolithic semiconductor transistor structure is described wherein the active collector region of a bipolar-junction transistor is physically and operatively merged with the channel region of a junction field-effect transistor, providing a composite circuit which approximates a cascode configuration. By controlling the integral of the net impurity doping concentration to various active regions of the device, the active collector region of a bipolar-junction transistor configuration is made sufficiently thin so as to simultaneously function as an active collector region as well as a channel region of one or more field-effect transistors. The channel-collector transistor provides high breakdown voltage, high dynamic resistance and linearity over a wide voltage range, and is compatible with solid-state batch fabrication processes for direct incorporation into larger integrated circuits. The device is particularly suitable for linear applications. Improved operating current is obtained and current limiting constraints of the device are minimized by cooperative emitter and base configurations, topologically extended to maximize use of available circuit area. Interdigitated base and collector region layout further improves operating performance.

16 Claims, 4 Drawing Sheets

CHANNEL COLLECTOR TRANSISTOR

The Government has rights in this invention persuant to Grant GK 39890 awarded by the National Science Foundation.

This is a continuation of Ser. No. 06/148,471, filed May 9, 1980, now abandoned, which was a continuation of Ser. No. 05/799,530, filed May 23, 1977, now abandoned.

CROSS-REFERENCES

To the extent used herein, teachings of U.S. Pat. No. 3,404,295 to R. M. Warner Jr., dated Oct. 1, 1968, with respect to the use of "lock-layer" principles in transistor design, are expressly herein incorporated by reference.

BACKGROUND OF THE INVENTION

1. Field of the Invention:

This invention relates generally to electronic solid-state amplifier devices, and more particularly to such a device which integrates bipolar junction transistor, field-effect transistor and lock-layer transistor principles in a single solid-state structure having advantages over devices employing only one or two of these component transistor principles.

2. Description of the Prior Art:

Since its inception, the bipolar transistor has become the "work horse" of the microelectronics industry, with relatively few basic improvements besides those relating to fabrication and processing (which have applied to the entire microelectronics and solid-state devices industry). One shortcoming of the conventional bipolar transistor structure was the fact that improvement in current gain of the device typically required reducing the metallurgical base thickness and "doping", which in turn directly limited the upper voltage rating of the transistor. In such devices, as increased voltage is applied to the collector of the transistor, the space-charge region associated with the collector junction expands in response to the increased voltage and extends farther into both the collector region and the base region of the transistor. While the expanded space-charge region has a relatively unimportant effect in the collector region of the transistor, it has a marked influence on transistor properties in the base region for the following reasons. It diminishes the effective base thickness, thus increasing the current gain of the transistor which in turn degrades the output impedance of the (common emitter) transistor, and it causes a voltage feedback from the output to input terminals of the transistor. This combination of phenomena is well known in the art as the "Early effect".

Initial effort in minimizing the Early effect and in achieving high breakdown voltage led to what is known in the art as the "intrinsic-barrier" structure which was later replaced by the "mesa" transistor which incorporated base-diffusion principles that were relatively simple to implement. In both cases, a lightly doped collector region and a heavily doped base region caused the space charge region to thicken preferentially on the collector side of the collector-base junction. While present designs of high-voltage, high-current gain transistors have improved significantly over the first such base-diffused transistors, the general design principles remain the same, requiring the designer to trade off current gain against the voltage rating of the transistor.

U.S. Pat. No. 3,404,295, by Warner, one of the co-inventors of this invention discloses a more recent prior art transistor structure which sought to minimize the Early effect, and increase breakdown voltage by use of a "lock-layer". The so-called lock-layer transistor operates to diminish or to eliminate the dependency of the active base thickness on collector-base voltage by burying an opposite conductivity-type region (i.e. the lock-layer) in the collector body portion of the transistor and by reverse biasing its junction. The lock-layer transistor concept was originally based on the principle that one space-charge region can "lock" the dimensions of another region that is sufficiently close to it. This principle can be illustrated by considering a three-region structure. To create locking, two junctions are formed very close to one another by placing a thin opposite-type layer between two like-type regions. By establishing a fixed potential difference (zero volts being acceptable) between the two like-type regions and by reverse biasing both junctions, a condition can be created such that the space-charge regions thus created touch one another. Once this occurs, additional increases in either reverse biase will not affect the dimensions of the space-charge regions in those portions of the device where they interact. An explanation of this phenomenon is that the two junctions "compete" for the ionic charge in the thin layer between them. Once that ionic charge is consumed in their respective space-charge regions, the two "double-layers" of charge have dimensions that are fixed or "locked". Therefore, if a junction of limited lateral extent is placed close to a larger plane junction and locking is established, the space-charge region of the plane junction will exhibit an indentation on its "far side". In other words, space-charge region increments associated with further voltage increases are "transplanted" to a location down inside the collector body, where their effects are minimal.

In the above-reference patent 3,404,295, the lateral extent of the "lock-layer" was restricted to approximately underlie the emitter region of the transistor. Such devices are not very effective in minimizing the Early effect, are not very effective in raising breakdown voltage, and are also difficult to fabricate.

An attempted improvement upon the Warner patent is disclosed in U.S. Pat. No. 3,564,356 to Wilson. Wilson discloses a high-voltage integrated circuit transistor that employs a collector region which is characterized by virtually complete depletion of majority carriers at a collector-emitter voltage which is less than the voltage at which the collector-emitter breakdown would otherwise occur. As a result of this depletion, the effective collector-emitter breakdown voltage of the resultant device is increased since the field intensity in the collector-base space-charge region is limited. It is a fact that transistors of this kind do not exhibit complete depletion of the collector region when operated at useful (non-zero) current levels. Wilson did not recognize this fact or the closely related fact that a thin collector region actually comprises the channel of a JFET. The channel region of a JFET at nonzero current is characterized by the condition of quasineutrality. Because Wilson did not recognize the presence of a JFET, he did not extend his analysis to include teachings of "merging" other active devices into the design of his basic transistor configuration, as is the intent of this invention. Accordingly, neither the Wilson structure nor his processing considerations recognize or teach the unique "integrated structural merging" properties and principles disclosed and taught by the present invention.

The present invention overcomes the shortcomings of prior art high-voltage, high-current-gain transistors by providing a monolithic, easy to fabricate channel-collector transistor characterized by bipolar junction transistor and field-effect transistor properties wherein the respective "collector" of the bipolar-junction transistor and the "channel" of the field-effect transistor are physically and functionally merged within a single operative solid-state device. The channel-collector transistor device is compatible with standard integrated circuit processing steps and can readily by incorporated into the design of larger integrated circuit networks as a component part thereof. The channel-collector transistor of this invention, when connected in common-emitter configuration, combines the current-gain advantages of the conventional common-emitter bipolar junction transistor with the output property advantages of a conventional common-base connected bipolar junction transistor (i.e. high breakdown voltage, high dynamic resistance and linearity). The channel-collector transistor can further be designed for a high current gain, to provide a transistor device capable of extremely high, linear voltage amplification. These advantages are obtained at the cost of higher saturation voltage and an upper limit on operating current, but there are many linear applications for this device, such as operational amplifiers, wherein such disadvantages are unimportant and where the advantages of the device enormously out-weigh any disadvantages thereof.

SUMMARY OF THE INVENTION

The present invention provides an improved apparatus and method for constructing by means of standard microelectronic batch fabrication techniques, a channel-collector transistor which "merges" in a single solid-state device, bipolar junction transistor (hereinafter referred to as BJT) and junction field-effect transistor (hereinafter referred to as J-FET) principles. The BJT and J-FET portions of the channel-collector transistor are merged by means of well-known standard microelectronic batch-processing principles into a single operative device. Heretofore, the BJT and J-FET were regarded as requiring incompatible design parameters. The resultant channel-collector transistor device is characterized by a collector region of a BJT which is made sufficiently thin so as to function also as the channel region of a junction field-effect transistor (i.e. the collector region of the BJT has been "merged" with the channel region of the JFET). The channel-collector transistor schematically approximates the combination of a BJT and a JFET operatively connected in a cascode configuration. The desired merged properties of the channel-collector transistor are obtained by controlling the integral of the net impurity doping concentration through the various operative regions, most notably the "active base region" and the "merged channel-collector region" lying below the "metallurgical base" region of the device. The integration is done in a "downward" direction, through these metallurgical regions. The structure which defines the lower boundary of the merged channel-collector region of the device may include, but is not limited to a lock-layer, a region of opposite conductivity type from that of the collector region, a dielectric insulator, or an air-insulator or void.

The channel-collector transistor principles of this invention offer a merged channel-collector device having a favorable marriage between breakdown voltage ($BV_{CEO}$ approximately equals $BV_{CBO}$) and current gain and having high linearity over a wide voltage range. The channel-collector transistor further has a large dynamic output resistance throughout the increased voltage range of the device. This resistance is much higher than that of a conventional BJT in the common-emitter configuration. Since the channel-collector transistor approximates a BJT/JFET cascode configuration, it provides significant design freedom with respect to Gummel number (i.e., the integral of the net impurity concentration through the active base region in a BJT) considerations, which in conventional BJT design requires a sufficiently high Gummel number for compromising between acceptable breakdown voltage and acceptable current gain of the transistor. In other words, the channel-collector transistor, in common-emitter connection, combines the current-gain advantages of the conventional common-emitter BJT with the output properties of a conventional common-base BJT—high breakdown voltage, high dynamic resistance, and linearity. Further, since the channel-collector transistor can be designed for high current gain, it is capable of extremely high, linear voltage amplification; whereas, in contrast, a JFET by itself is a non-linear voltage amplifier, approximately square-law behavior.

A cross-sectional topological view of the most basic channel-collector transistor resembles that of a conventional BJT, having upper and lower surfaces or boundaries between which a collector region of a first conductivity-type extends. A base region of second conductivity-type extends from the upper surface or boundary into the collector region with the outermost boundaries of the base region forming a p-n junction with the collector region (note that unless otherwise stated herein, no polarity significance is being attributed to the order of the letters in the term "p-n junction"). An emitter region of the first conductivity-type extends from the upper surface into the base region, with the outermost boundaries of the emitter region forming a p-n junction with the base region. Ohmic contacts for external electrical access to the base and emitter regions are typically made at the upper surface of the device. Depending upon the application for the channel-collector transistor and upon the characteristics of the material, if any, underlying the lower effective boundary of the collector, the ohmic contact areas for the collector region may lie at either the upper or lower boundaries of the device.

An operative channel-collector transistor device is obtained from the above described basic topological structure by proper constraint of the pattern of the net impurity concentrations and dimensions within specified portions of the device. These quantities may be specified as products of: (net impurity concentration) X (thickness of depth over which controlled), or more properly as the integral of the net impurity concentration through the thickness or depth of the region over which the impurity concentration is to be controlled. For simplicity, these "control numbers" will be referred to as N1, N2, etc. By setting appropriate values of limits on the control numbers, the physical geometries and the diffusion and/or other fabrication processing steps affecting the impurity concentration levels within the specifically controlled regions can be readily determined.

In designing a channel-collector transistor, the designer is free to select a first control number "N1" for the active base region (that portion of the base region which extends directly below the emitter region and downward to the base-collector junction) of the intrinsic BJT portion of the device, that is less than $2 \times 10^{12}$ cm$^{-2}$. The second control number "N2" applies to that portion of the collector region of the device which extends directly below the emitter region and between the base-collector junction and the lower effective boundary of the device, and it should be greater than $10^{11}$ cm$^{-2}$. The region thus controlled by the N2 control number forms an "intervening FET" having its channel region merged with the collector region of the BJT portion of the device. The third control number "N3" for controlling that portion of the collector region which extends directly below the base region of the device and down to the lower effective boundary of the collector region, except for that portion thereof lying directly below the emitter region, should lie within the range of $10^{11}$ cm$^{-2}$ to $2 \times 10^{12}$ cm$^{-2}$. This region described for control by the N3 control number forms an "intrinsic FET" having its channel merged with the collector region of the intrinsic BJT portion of the device.

The basic channel-collector transistor device described above may assume numerous embodiments in mounting or engagement with other surfaces, in topological variations and in fabrication processing and layout steps used to construct the device. The effective lower boundary of the above-described collector region of the device may be supported by or otherwise come into direct contact with any medium which is operable to prohibit current flow across the lower or effective boundary of the collector region. Such configurations include but are not limited to air (i.e. a void, or the absence of any solid medium engaging the lower effective boundary of the collector region), a dielectric or other insulating substrate material, a semiconductor material of appropriate conductivity-type biased to form a reverse-biased p-n junction at the lower or effective collector boundary, or a lock-layer as substantially described in U.S. patent No. 3,404,295.

Various microelectronic processing principles such as the so-called "J process" for making improved JFETS, can be readily applied to the fabrication of channel-collector transistor devices within the spirit and intent of this invention. Similarly, the topological cross-sectional shapes of various portions of the channel-collector transistor device, such as the cross-sectional shape of the base region thereof, can be modified within the spirit and intent of this invention, for example, to compensate for the effects of various processing steps selected for fabricating the device. One such variation comprises a modification of the cross-sectional shape of the base region to compensate for detrimental effects of what is commonly known as "emitter push" inherent in the fabrication of diffused emitter devices. Similarly, the topology of the channel-collector devices, when seen in plan view, can assume many varied configurations for maximizing desired parameters such as current gain or to minimize undesirable characteristics inherently introduced into the device by the particular process steps employed in its fabrication. Due to the unique merging properties of the device, certain topological variations thereof, which were heretofore thought of as impractical in the design of conventional BJT and FET devices are possible. For example, by interdigitating the collector and base regions of the device and by using a serpentine-type emitter configuration, channel-collector transistor devices displaying significantly increased operating current can be produced. These and many other variations of the device will be apparent to those skilled in the art, in view of the teachings submitted herein, and logically fall within the spirit and broad scope of this invention.

BRIEF DESCRIPTION OF THE DRAWING

Referring to the Drawing, wherein like numerals represent like parts throughout the several views.

DESCRIPTION OF THE PREFERRED EMBODIMENT

Figure 1:
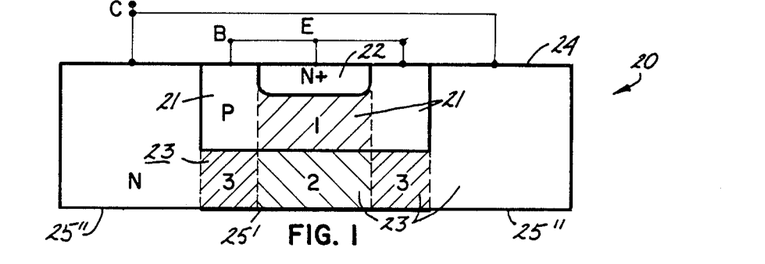
FIG. 1 is a diagrammatic illustration, in cross section, of a channel-collector transistor constructed according to the principles of this invention, and illustrating those active regions of the transistor requiring special process control.

Referring to the Drawing, there is illustrated in FIG. 1 a cross-sectional view of a channel-collector transistor 20, which resembles a conventional bipolar junction transistor (BJT). The transistor has a base region 21, an emitter region 22 and a collector region 23. The base region may be of p-type conductivity material as illustrated, with the emitter and collector regions being of n-type conductivity material to form an npn transistor.

However, it will readily be appreciated that the invention is also applicable to a pnp type transistor wherein the conductivity types of the various respective regions illustrated in FIG. 1 are reversed with respect to those illustrated in FIG. 1. Throughout the following description and in the Drawing, in describing the preferred embodiments of the present invention, it will be understood that the Drawing figures are diagrammatic and schematic in nature, and do not reflect all structural and fabrication details of actual physical devices (i.e. respective active region dimensions are not scaled in the Drawing and are not in proportion to those dimensions of actual devices, oxide layers formed during processing steps are not illustrated, actual shapes of various active regions of the device are grossly approximated to emphasize the concepts involved, etc.).

If that portion of the collector region 23 which directly underlies the metallurgical base region 21 of the transistor 20 is made sufficiently "thin" (as hereinafter described in more detail), this collector region can, with the proper selection of impurity doping concentration levels within this region, be made to function as the channel region of a junction field-effect transistor (JFET), as well as the active collector region of the bipolar junction transistor (BJT). In other words, the collector region of thE BJT can be "merged" with the channel region of the resultant JFET. Referring to FIG. 1, that portion of the transistor 20 within the dashed lines indicated by the numeral "1" is typically referred to as the "active base region". That portion of the collector region 23 which directly underlies the metallurgical base region 21 of the transistor 20 is subdivided into two regions designated within the dashed line portions indicated by the numerals "2" and "3" respectively. The combination of the "2" and "3" portions of the collector region 23 collectively comprise the "active collector region" of the transistor 20 and simultaneously function as the channel region of two FETs when the active channel-collector region is made sufficiently "thin" in an operative sense. That portion of active collector region designated by the numeral "2" forms the channel portion of an "intervening FET", and that portion of the active collector region designated by the numeral "3" forms the channel portion of an "intrinsic FET".

Referring to FIG. 1, the upper boundary of the channel-collector transistor 20 has been labeled as 24. The lower boundary of the active region of the channel-collector transistor 20 has been labeled generally as 25. In FIG. 1, the lower boundary 25 is coterminous with the entire lower boundary of the collector region 23; however, for ease of description of alternative embodiments of the invention, the lower boundary 25 may be subdivided into an "effective" lower boundary 25' which directly underlies the metallurgical base region 21 of the device, and a second lower boundary 25" which may or may not be coplanar with the effective lower boundary 25', and which does not engage or bound the active channel-collector regions "2" and "3" of the transistor 20.

Figure 15:
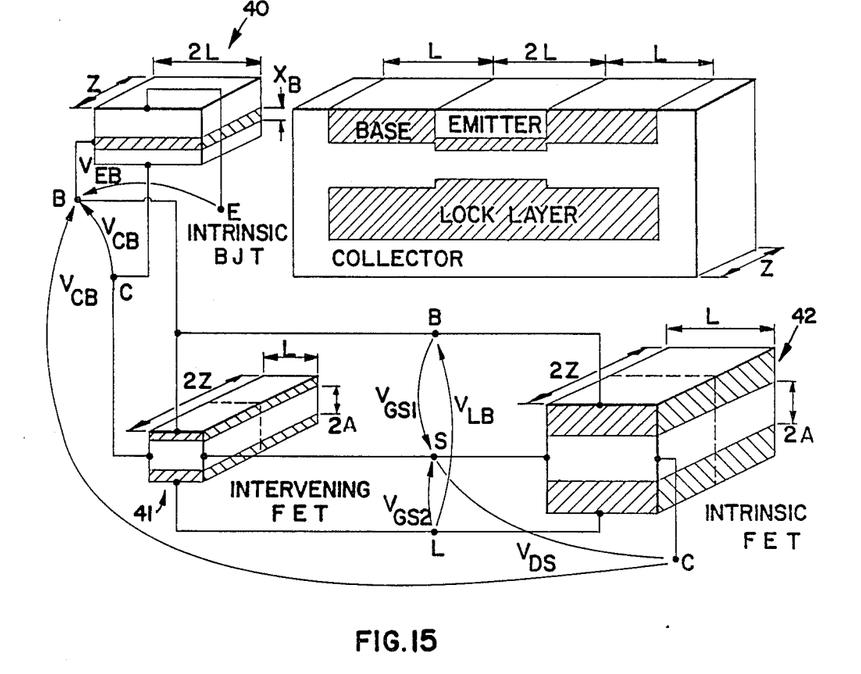
FIG. 15 is a diagrammatic illustration, in cross section, of a channel-collector transistor similar to that illustrated in FIG. 2, illustrating a diagrammatic separation of the respective intrinsic BJT, the intervening FET and the intrinsic FET active portions of the device.

A more illustrative diagram depicting the subdivision of the constituent devices which are operatively merged within the channel-collector transistor 20 is shown in FIG. 15. Referring thereto, the three constituents devices (from a physical model viewpoint) which comprise the channel-collector transistor 20 are an "intrinsic BJT" designated generally at 40, an "intervening FET" generally designated at 41, and an "intrinsic FET" generally designated at 42.

The intrinsic BJT 40 can be generally modeled using well-known theory, and is physically approximated by the emitter region 22, that portion of the base region 21 directly underlying the emitter region 22, and that portion of the colletor region 23 which directly underlies the emitter 22.

The intervening FET 41 directly underlies the BJT emitter 22, and physically comprises the active base portion of the base region 21, the "2" zone of the active collector region 23 and that portion of a lock-layer 30 (described in U.S. Pat. No. 3,404,295 incorporated herein by reference) which directly underlies the BJT emitter 22. The channel portion "2" of the intervening FET is physically and operatively "merged" with the active collector portion of the intrinsic BJT 40. The intervening FET 41 can be analyzed using existing JFET theory, modified to account for the fact that current is being delivered to the channel along its length (i.e. using two-dimensional considerations).

The intrinsic FET 42 illustrated in FIG. 15, comprises the region formed between the upper boundary 24 of the device 20 and the lock-layer 30, exclusive of that portion of the device which directly underlies the emitter region 22. The intrinsic FET 42 physically comprises the base region portions 21 which lie laterally adjacent the emitter region 22, that portion of the active collector region 23 designated by the numeral "3" in FIG. 1, and that portion of the lock-layer 30 which does not underlie the emitter region 22. The channel portion "3" of the intrinsic FET 42 is physically and operatively "merged" with the respective active collector portion of the channel-collector transistor. The intrinsic FET 42 can be analyzed by the use of existing four-terminal JFET theory, which allows for independent gate-source voltages on the two gates of the device.

Figure 6:
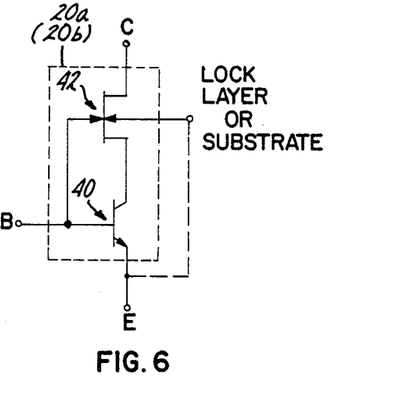
FIG. 6 is a schematic diagram of an approximate first order equivalent circuit of the channel-collector transistor devices disclosed in FIGS. 2 and 3.
Figure 7:
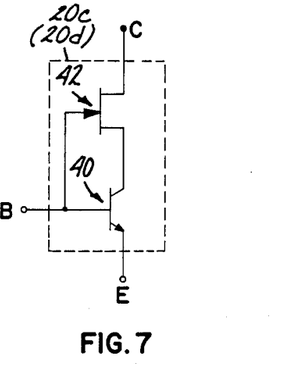
FIG. 7 is a schematic diagram of an approximate equivalent circuit of the channel-collector transistor devices disclosed in FIGS. 4 and 5.

The equivalent circuit of the channel-collector transistor constructed according to the principles of this invention, approximates a BJT and JFET in a cascode configuration. Two variations of the cascode configuration for the channel-collector transistor are illustrated in FIGS. 6 and 7. The particular resultant equivalent circuit obtained will depend upon the specific configuration (i.e. embodiment) of the channel-collector transistor which is constructed (described hereinafter in more detail). While the simple BJT-FET cascode circuit characterization of the channel-collector transistor is a useful first-order equivalent circuit, the "merged" qualities of the channel-collector transistor give this device "merged properties" that cannot be achieved with interconnected discrete components. Where these "merged properties" are important, the equivalent circuit represents too limited a description of the device. Therefore, it must be understood that the cascode circuit configuration is a best attempt at a simple-to-use first-order equivalent circuit for the channel-collector transistor, which can simultaneously be too broad and too limiting for completely analyzing the channel-collector transistor structure. However, the cascode configuration equivalent circuit serves a useful purpose in teaching the basic properties of the channel-collector transistor device. Further, whil the equivalent circuits of the respective channel-collector transistor devices approximate a BJT-FET cascode configuration, it will be understood that the composite circuit functions more as a BJT than as a FET, and that the FET portions of the composite device operatively function somewhat as "slaves" to the BJT portion thereof.

The ability of the channel-collector transistor configuration to "merge" a BJT collector and an FET channel requires that the channel-collector region of the device which is to become "merged", be sufficiently "thin" from an operative design viewpoint. The desired "thinness" of the channel-collector portion of the device is achieved by selection of appropriate "control numbers", previously designated as N1, N2 and N3, for the "1", "2" and "3" critical regions of the channel-collector transistor (see FIG. 1). As previously discussed, the so-called control numbers are defined as the integral of the net impurity concentration through the thickness or depth of the particular region over which the impurity concentration is to be controlled (i.e. over the respective depths of the respective "1", "2" and "3" regions, as measured in the downward or "y" direction in FIG. 1).

Referring to FIG. 1, the "1" region corresponds with the active base region of a conventional BJT. In BJT design, current gain is typically written in terms of the Gummel number which is equivalent in definition to the N1 "control number" used in this specification (i.e. the integral of the net impurity concentration through the thickness of the active base region of the BJT). High current gain is favored by a low value for this number, but high $BV_{CEO}$ is favored by a high value for the Gummel number. The typical value selected for the Gummel number in conventional BJT designs is about $2 \times 10^{12}$ cm$^{-2}$, which represents an engineering compromise between the current gain and $BV_{CEO}$ requirements. With the channel-collector transistor, the designer is free to select a considerably smaller Gummel or "control number" N1 for the "1" region (FIG. 1), without sacrifice of $BV_{CEO}$, because of the cascode configuration of the circuit, in which a true or quasi JFET provides high breakdown voltage and in effect protects the BJT from experiencing the applied voltage, except for a very small portion thereof. Accordingly, in significant departure from conventional BJT design constraints, the N1 control number for the active base region in the design of channel-collector transistors can be much "less" than $2 \times 10^{12}$ cm$^{-2}$.

The N2 control number applies to that portion of the active collector region 23 of the device designated as "2" in FIG. 1. This region corresponds to the "channel" portion of the intervening FET 41 portion of the device which actually acts to decrease the effectiveness of the device. Accordingly, the control number for N2 should be selected to be greater than $10^{11}$ cm$^{-2}$.

The third control number N3 applicable to that portion of the active collector region 23 designated as "3" in FIG. 1 is important, since the "3" region functions as a JFET channel for the intrinsic FET portion 42 of the device. Accordingly, the "3" region should have a N3 value in the range from $10^{11}$ cm$^{-2}$ to $2 \times 10^{12}$ cm$^{-2}$. Selection of this range of values for N3 reflects an engineering compromise in JFET design, between pinch-off voltage ($V_p$), the desired low value of which is favored by a low value of N3, and characteristic current ($I_{DSS}$), the desired high value of which is favored by a high value of N3. It should be noted that the nonoverlapping ranges for N1 and N3 account for the classic incompatibility, from a process fabrication viewpoint, of the conventional BJT and JFET structures—an incompatibility which exists in spite of the strong topological similarity of these devices. In contrast to conventional BJT devices which require a significantly higher Gummel Number, for the active BJT base region, the N1 control number for comparable topological portions of the channel-collector transistor is significantly less than in the conventional BJT sesign. Similarly, the concentration of impurities per unit area for the collector region of a conventional BJT is significantly greater than the comparable N3 control number of the channel-collector transistor design. Selection of the three control numbers N1, N2 and N3 within the above-suggested ranges and selection of the appropriate physical-dimensions and processing steps to satisfy the selected control number requirements, will insure sufficient "thinness" of the merged channel-collector region of the device, such that the device will exhibit the desired "merged" channel-collector transistor properties.

In short, the channel-collector transistor device, by virtue of the merged channel-collector phenomenon, combines the current-gain advantages of the conventional common-emitter BJT with the output properties of a conventional common-base BJT (i.e. high breakdown voltage, high dynamic resistance, and linearity). Further, because it can be designed for high current-gain, the resulting channel-collector transistor device is capable of extremely high, and linear voltage amplification. It will be recalled that a JFET alone, is by contrast, a nonlinear voltage amplifier, approximating square-law behavior. Sample channel-collector transistor devices built according to the principles of this invention have displayed current-gain values in excess of 1000 at $V_{CE}=60$ volts and $I_C=5$ milliamps, which represents a significant improvement over conventional-type BJT devices.

Given emitter and base regions of more-or-less conventional structure, and the control number (N1 through N3) design guidelines above defined, one can device numerous configurations to achieve the desired thin channel-collector region. Four such design possibilities or embodiments of the channel-collector transistor 20 are illustrated in FIGS. 2–5. For ease of analysis, numbering identity for like parts is common throughout the various embodiments of the channel-collector transistor, with suffix letters added to the basic identifying numbers, to distinguish the various embodiments of the invention. For example, the emitter region 22 in FIG. 1 is designated as 22a in FIG. 2, 22b in FIG. 3, etc.

Figure 2:
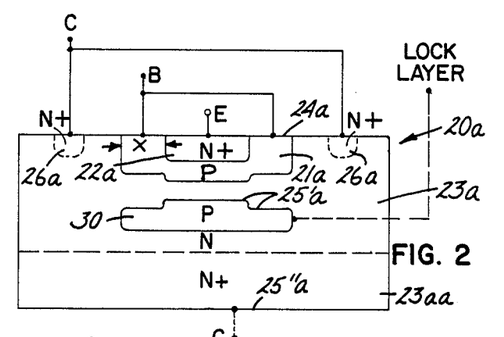
FIG. 2 is a diagrammatic illustration, in cross section, of a first embodiment of a channel-collector transistor constructed according to the principles of this invention, which employs a lock-layer region.

Referring to FIG. 2, the effective lower boundary 25'a of the collector region 23a comprises the upper surface of a "lock-layer" 30 submerged within the collector 23a. Principles of space-charge region "locking" in BJT devices are basically explained within U.S. Pat. No. 3,404,295 (incorporated herein by reference), and will not be detailed herein. However, such "locking" is largely irrelevant at useful (nonzero) current levels, where the JFET properties are important. The configuration illustrated in FIG. 2, however, significantly varies from that device illustrated in U.S. Pat. No. 3,404,295, in that the lock-layer 30 of the FIG. 2 device extends laterally substantially across (in underlying manner) the entire metallurgical base region of the channel-collector transistor. This is in marked contrast to the teachings of U.S. Pat. No. 3,404,295, wherein the lock-layer disclosed therein is co-extensive only with the "active" base region of the transistor. Extension of the lock-layer 30 to underlie the "entire" metallurgical base region of the transistor enables formation of the merged channel-collector region of the intrinsic FET 42 portion of the channel-collector transistor 20a, as configured in FIG. 2. The dashed line leading to the lock-layer in FIG. 2, schematically illustrates that this configuration of the channel-collector transistor may be designed as illustrated in U.S. Pat. No. 3,404,295, so as to directly bias the submerged lock-layer 30. The n+ region of the collector, designated as 23aa in FIG. 2 represents a heavily-doped region, well-known in the BJT art for increasing the conductivity in the collector portion of the device.

Electrical contact to the respective portions of the channel-collector transistor which are to represent the output terminals of the device are schematically illustrated in FIG. 2 as: "C" (the collector output terminal), "B" (the base output terminal) and "E" (the emitter output terminal). It will be noted that shallow (n+) diffusion areas designated at 26a extend from the upper surface or boundary 24a of the device for enhancing electrical connection to the collector region 23a of the device. It will also be noted that the structure of the channel-collector transistor 20a lends itself to direct bonding of the lower collector surface (25"a) to a substrate member, as indicated by the dashed collector (C) terminal at the lower portion of the device.

Subject to the limitations described above, the first order equivalent circuit of the channel-collector transistor 20a, is illustrated in FIG. 6. Comparison of the equivalent BJT-FET cascode configuration circuit of FIG. 6 with the physical configuration of FIGS. 2 and 15, will disclose that the "source" of the n-channel FET (i.e. the intrinsic FET 42) and the "collector" of the intrinsic BJT 40 portion of the channel-collector transistor are directly connected or "merged" within the structure of the device. The same holds true for the BJT "base" and the FET "gate" terminals. The "drain" terminal of the intrinsic FET 42 portion of the channel-collector transistor 20 represents the output "collector" terminal for the composite device structure. An additional terminal designed in FIG. 6 as "lock-layer" or "substrate", when available in the physical structure, enables potentials to be directly applied to the lock-layer portion of the channel-collector transistor 20a, or directly to the substrate portion of the channel-collector transistor 20b of FIG. 3 (hereinafter described).

Figure 3:
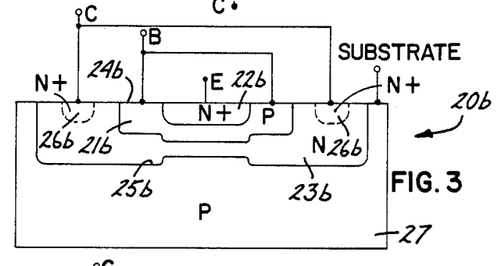
FIG. 3 is a diagrammatic illustration, in cross section, of a second embodiment of a channel-collector transistor constructed according to the principles of this invention, which employs a semiconductive supporting substrate layer.

A second possible configuration of the channel-collector transistor design is illustrated at 20b in FIG. 3. Referring thereto, the lower effective boundary 25b of the collector region 23b lies directly adjacent a p-type conductivity substrate, which prevents, when reverse biased, election current flow from the collector region 23b across the lower collector boundary 25b. The substrate material 27 may comprise any semiconductor material appropriate for forming an operative p-n junction with the lower boundary 25b of the overlying collector region 23b.

Figure 16:
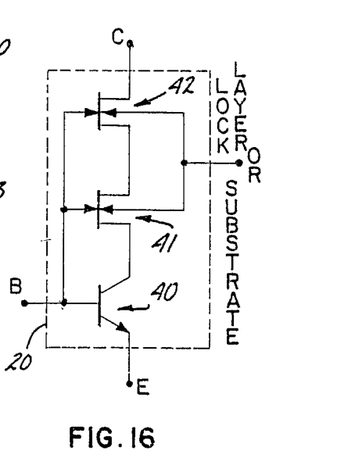
FIG. 16 is a schematic diagram of an approximate equivalent circuit of the channel-collector transistor of this invention, illustrating the intrinsic bipolar transistor, the intrinsic field-effect transistor and the intervening field-effect transistor portions thereof, which are diagrammatically disclosed in FIG. 15.

The equivalent BJT-FET cascode configuration circuit of FIG. 6 applies equally well to the second embodiment of the channel-collector transistor 20b as to the first embodiment of the channel-collector transistor 20a, whereby the semiconductor substrate 27 replaces the lock-layer 30 for electrical analysis considerations. It will be noted that the intervening FET portion 41 is not present in the equivalent circuits of FIGS. 6 and 7. A more complete and accurate equivalent circuit of the channel-collector transistor device 20 of the types disclosed in FIGS. 2 and 3 is illustrated in FIG. 16, wherein the intervening FET 41 is shown in series with the intrinsic FET 42 and the intrinsic BJT 40. In the first-order equivalent circuits of FIGS. 6 and 7, it has been assumed that the detremental (i.e. current limiting) effects of the intervening FET 41 on the operation of the complete channel-collector transistor device are negligible. In practice, whether or not the detrimental effects of the presence of the intervening FET portion 41 on the overall operation of the composite device 20 can be neglected, will depend upon the particular topological design of the channel-collector transistor 20. Various techniques and configurations for minimizing the presence of the intervening FET 41 will be described hereinafter in more detail. For the present, it will be assumed that the particular device 20 design has been configured tgo minimize any undesirable current limiting effects of the intervening FET 41 and, therefore, that the first-order equivalent cascode circuit configuration of FIGS. 6 and 7 are adequate for approximating the device 20 operation.

Figure 12:
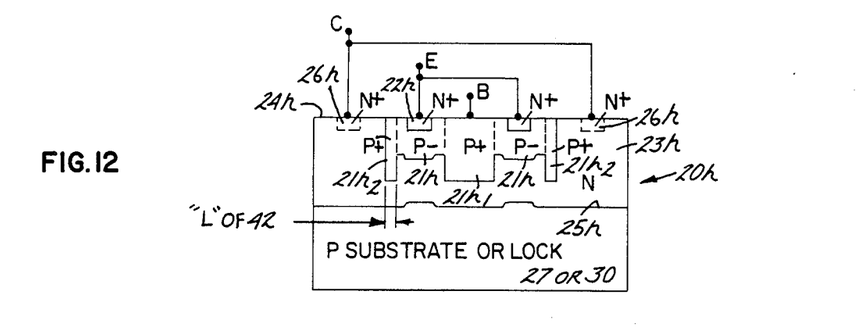
FIG. 12 is a diagrammatic illustration, in cross section, of the channel-collector transistor illustrated in FIG.11, as generally viewed along the Line 12—12 of FIG. 11.

It will also be appreciated upon a review of the segmented portions of the composite channel-collector transistor 20 illustrated in FIG. 12, that that portion of the device designated as the intervening FET 41 is not in fact a true FET according to the definitions of such devices, since current flow through the so-called intervening FET 41 passes directly through the entire upper layer 21 of the device—in a manner not typical of conventional FET devices. However, the so-called intervening FET 41 does act somewhat as a J-FET, particularly with respect to its "pinch-off" characteristics.

Figure 4:
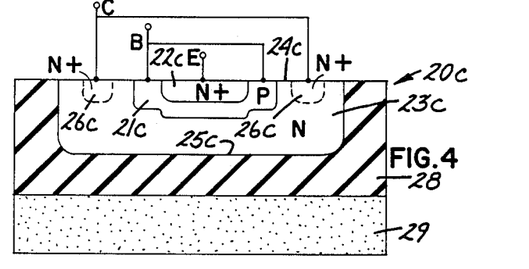
FIG. 4 is a diagrammatic illustration, in cross section, of a third embodiment of a channel-collector transistor constructed according to the principles of this invention, which employs dielectric isolation principles.

A third configuration of a channel-collector transistor constructed according to the principles of this invention, is disclosed at 20c in FIG. 4. Referring to FIG. 4, the lower or external boundary 25c of the collector region 23c of the channel-collector transistor 20c is directly engaged by a dielectric isolation barrier 28, which is compatible with well-known dielectric isolation fabrication techniques for solid-state devices. In its most common form this technology incorporates a layer of silicon dioxide 28 overlying a layer of polycrystalline silicon 29 which is sufficiently thick to serve as a mechanical support for both the insulating layer 28 and the thin layer of single-crystalline silicon in which the devices (in this case, the channel-collector transistor 20c) are formed. It will be obvious in view of this disclosure that the two-layer configuration (i.e. layers 28 and 29) of FIG. 4 could equally well be replaced with a single insulator substrate, within the spirit and intent of this invention.

Subject to the same above-described considerations with respect to the intervening FET 41, a schematic diagram of the first-order equivalent circuit for the channel-collector transistor 20c is illustrated in FIG. 7. The FIG. 7 circuit is identical to that circuit illustrated in FIG. 6 with the deletion of the underlying lock-layer 30 or substrate 27 available with the 20a and 20b channel-collector transistor circuits respectively.

Figure 5:
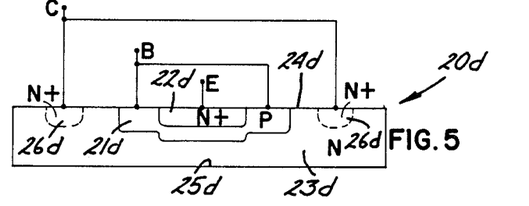
FIG. 5 is a diagrammatic illustration, in cross section, of a fourth embodiment of a channel-collector transistor constructed according to the principles of this invention, illustrating a device, wherein an air layer or material-void lies adjacent the lower collector boundary of the device.

A fourth embodiment of a channel-collector transistor constructed according to the principles of this invention is illustrated at 20d in FIG. 5. Referring thereto, the insulating support layer structure of the 20c channel-collector transistor is replaced by an "air-insulation" or a "void" underlying the lower boundary 25d of the channel-collector region 23d of the device. Applications for such "thin" active silicon devices occur in the field of pressure transducers. The advantage of the channel-collector transistor 20c and 20d configurations is the effective elimination of the parasitic capacitance associated with one of the channel-defining junctions of the 20a and 20b channel-collector transistors, with a consequent improvement in bandwidth. The equivalent circuit described in FIG. 7 applies equally well to the channel-collector transistor of FIG. 5.

It will be appreciated, in view of the varied substrate support and implementation configuration for the channel-collector transistor 20 which have been described with reference to FIGS. 2–5, that many such design variations can be implemented within the spirit and broad scope of this invention. The important consideration for the selection of an adjacent layer which engages the lower boundary 25 of the collector region 23 of the channel-collector transistor 20, is that such selected material or lack thereof, should not allow majority carrier (electron) current flow across the lower collector boundary 25.

It will be appreciated from a review of the basic topological configurations for the channel-collector transistor (FIGS. 2–5) and the component active portions thereof (FIG. 15), that to insure that the merged channel-collector portion of the composite device 20 perform in the intended manner (i.e. that the intrinsic FET portion 42 of the composite device does in fact function as a FET, the width of that base region which extends laterally from the active base region to the edge of the collector region 23 (i.e. the "x" dimension in FIGS. 2 and 17) must be greater than the depth of the channel portion of the intrinsic FET 42 by a factor which insures operation of the intrinsic FET 42 as a FET. A factor of approximately "4" should suffice to insure FET operation of the intrinsic FET 42.

Figure 8:
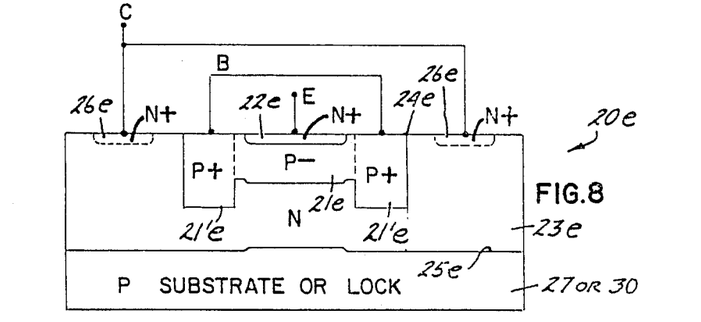
FIG. 8 is a diagrammatic illustration, in cross section, of a fifth embodiment of a channel-collector transistor constructed according to the principles of this invention, illustrating a modification of the base region of the transistor.

Besides modifications to the materials and configurations of that portion of the channel-collector transistor 20 which lies within or external of the collector region 23 thereof, modifications in the shape and configuration of the basic active portions of the channel-collector transistor can be designed within the scope of this invention. Referring to FIG. 8, a fifth embodiment of a channel-collector transistor 20e is illustrated, wherein the base region 21e of the transistor 20e has been configured to include a pair of narrow base diffusion regions (designated at 21'e) which skirt or surround a relatively shallow central base portion 21e, which can be formed, for example, either by a shallow boron (in the case of a p-type base) diffusion or by the use of ion-implantation techniques. It will be noted that the peripheral (p+) base portions (21'e) extend significantly deeper into the collector region 23e of the channel-collector transistor 20e, than the central base portion 21e. The emitter 22e in this configuration is also very shallow. The advantages of such a structure are that the current limiting of the intervening FET 41 of the composite channel-collector transistor 20e is either substantially reduced or eliminated, and the undesirable characteristics attributable to the phenomenon commonly known as "emitter-push" inherent in the 20a and 20b channel-collector transistor structures are minimized. With the use of this configuration, the intervening FET 41 acts more as a low-value resistor than as a FET, connected in series between the intrinsic FET 42 and the intrinsic BJT 40. With this configuration, the intrinsic FET 42 portion of the composite device 20e can be constructed with relatively high (W/L) aspect ratios. The structure is also compatible for use with very high-current-gain BJT's. It will be noted that in the 20e channel-collector transistor structure, the extended base region (21'e) forms one gate of the intrinsic FET 42 portion of the composite channel-collector transistor 20e.

Figure 9:
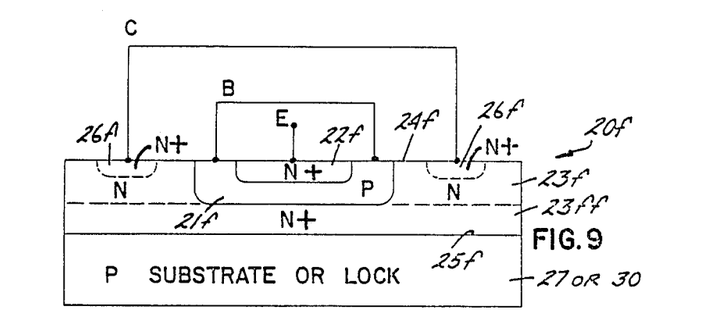
FIG. 9 is a diagrammatic illustration, in cross section, of a sixth embodiment of a channel-collector transistor constructed according to the principles of this invention, illustrating use of the "J process" for making improved JFETs, in the channel-collector transistor design.

A sixth embodiment of a channel-collector transistor constructed according to the principles of this invention is illustrated at 20f in FIG. 9. The 20f channel-collector transistor configuration employs what is sometimes referred to as the "J process" for making improved JFET's. Referring to FIG. 9, the collector region of the device is divided into a heavily-doped, very thin (n+) region 22ff which becomes the merged channel-collector portion of the device, and a more lightly doped n-type region on top of which the BJT base and resultant gate portions of the intrinsic FET portion 42 of the channel-collector transistor 20f are formed. The (n+) and n layers, 23ff and 23f respectively, are grown epitaxially. The advantage of this configuration is that as the upper gate (i.e. the p-type diffusion) is formed, the downward diffusion "stops" when it comes into engagement with the (n+) region 23ff—the result being a much more uniform and reproducible merged channel-collector region than can be achieved by diffusion of a gate into a single uniformly-doped n-type layer. This configuration also helps to reduce the variations in the thickness of the merged channel-collector portion of the device.

Figure 10:
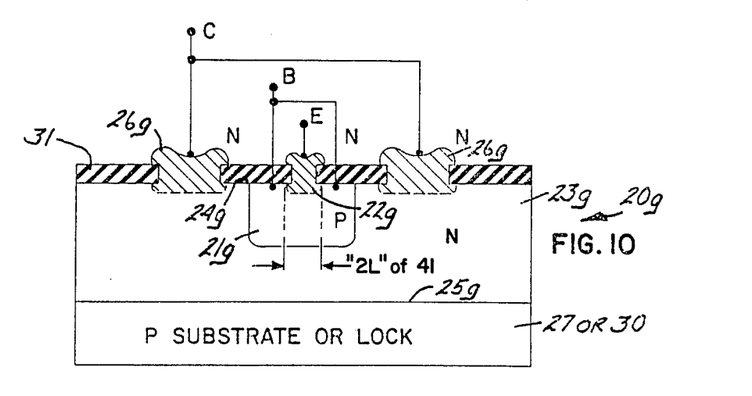
FIG. 10 is a diagrammatic illustration, in cross-section, of a seventh embodiment of a channel-collector transistor constructed according to the principles of this invention, illustrating a modification of the emitter region to include a polysilicon emitter configuration.

A seventh embodiment of a channel-collector transistor constructed according to the principles of this invention is illustrated at 20g in FIG. 10. Referring thereto, the channel-collector transistor 20g illustrated is constructed with the use of what is called the "polysil-emitter process". The polysil-emitter process has typically been used in the fabrication of BJT devices for increasing the current-gain, reducing the base resistance and significantly reducing the physical size of bipolar npn transistors. By use of the polysil-emitter-process, the width of the emitter can be made very narrow.

Since the emitter "width" is also twice the "L" dimension (illustrated in FIG. 10) of the intervening FET portion 41 of the composite channel-collector transistor device, use of this process helps to minimize the effect of the intervening FET 41 as a current limiting element in the equivalent circuit of the channel-collector transistor 20g (see FIG. 15). As will become apparent upon a more detailed description of embodiments of the invention which are configured to increase operating current of the channel-collector transistor 20, it will be recognized that the emitter 22g can also be placed in relatively close proximity with the edge of the base region 21g, to minimize the "L" dimension of the W/L aspect ratio of the intrinsic FET portion 42 of the composite device.

Referring to FIG. 10, it will be noted that both the collector contact areas 26g and the emitter 22g are formed by means of the polysil-emitter process. It will be noted that a surface oxide layer 31 is illustrated as directly overlying the upper surface boundary 24g of the channel-collector transistor 20g. The oxide layer 31 is typically present on the upper surface 24 of all channel-collector transistor devices 20, but for simplicity, has been omitted from the remaining diagrammatic illustrations in the Drawing. The polysil-emitter process can basically be described as follows. Windows are etched in the oxide layer 31 overlying those areas of the upper surface 24g which are to define the emitter 22g and the (n+)collector contact areas 26g. The "polysil", which is an undoped polycrystalline silicon layer, is deposited across the entire transistor 20g surface. The n-type dopant (i.e. impurities) within the polysil is then made to diffuse through the polysil layer and into the underlying base region 21g and collector region 23g below the respective window openings overlying those regions. During the so-called diffusion process, however, the high doping concentration is confined to a layer that remains very close to the upper surface 24g of the device 20g, such that the so-called diffusions are very shallow. This process virtually eliminates "emitter-push" which is inherent in standard diffusion processes, thereby maintaining the depth of the channel portion of the intervening FET 41 in the "2" zone (see FIG. 1) the same as the channel depth of the intrinsic FET 42 in the "3" zone—thus minimizing the increased current limiting of the intervening FET 41 which is caused by the "emitter-push" when standard diffusion processes are employed. The polysil is next etched so that an overlapping "cover" which extends above the upper surface of the oxide layer 31, remains for contact to the respective collector and emitter metallization patterns. Accordingly, use of the "polysil-emitter" process can be employed to increase the efficiency of the channel-collector transistor 20g and to significantly increase the operating current-carrying capability of the device for a given area.

Many other such design variations for the channel-collector transistor 20 which are not specifically disclosed in the Drawing of this specification (the configurations of FIGS. 2-10 being only representative examples thereof), will become apparent to those skilled in the art in view of the teachings of this invention. In particular, it will become apparent to those skilled in the art to employ ion-implantation techniques, for example, in fabricating an active base region of the intrinsic BJT portion of the device, to create a low N1 control number. Similarly, many variations of "buried layer" configurations will be found suitable for application with the teachings of this invention. Also, as will become evident upon a description of other possible configuration variations discussed with respect to FIGS. 11-13, each of the various configurations of the channel-collector transistor 20 illustrated in FIGS. 2-5 and 8-10 is compatible with interdigitation techniques described below, for increasing the operating current of the device.

Operating current of the basic channel-collector transistor device 20 can be increased by appropriate topological designs which increase the W/L aspect of the intrinsic FET portion 42 of the merged device 20, to the desired value. One way of increasing the W/L ratio is to form the emitter of the intrinsic BJT 40 within the base region thereof in a manner so as to minimize the "L" dimension of the W/L aspect ratio of the intrinsic FET 42. This can be done by forming the emitter region 22, as close as operatively possible, to the outer lateral edge of the base region 21.

Figure 11:
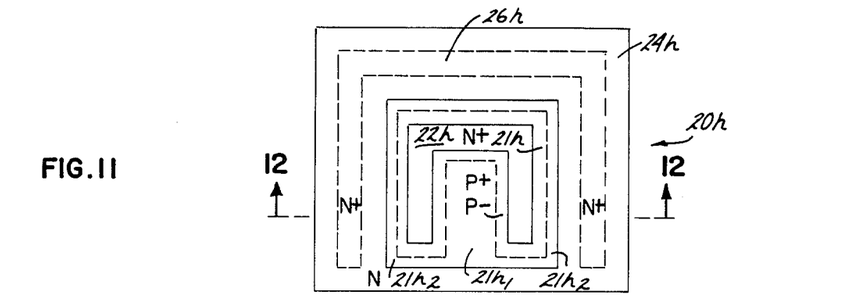
FIG. 11 is a diagrammatic illustration, in top plan, of a channel-collector transistor constructed according to the principles of this invention, illustrating a U-shaped and emitter configuration and employing a variation of the base cross-sectional configuration disclosed in FIG. 8.

One method of achieving such "L" minimization is illustrated in FIGS. 11 and 12. Referring thereto, the channel-collector transistor 20h has an emitter region 22h bent in a U-shape configuration within the underlying base region 21h and very close to the lateral edge of the base region 21h so as to minimize the "L" dimension of the intrinsic FET 42 W/L aspect ratio. It will be noted that the cross-sectional shape of the base region 21h of FIG. 12 is a logical variation of the shape of the base region 21e of FIG. 8. Referring to FIGS. 11 and 12, the channel-collector transistor 20h has a fairly wide centrally located (p+) region 21hl which enables adequate "physical" area at the upper surface 24h for making a good ohmic contact to the base region. With the electrical contact being made in this manner, at the central portion of the base, the outermost relatively deep (p+) base regions labelled as 21h2, can be made sufficiently "narrow" so as to decrease the "L" value of the channel portion of the intrinsic FET portion 42 of the composite device. It will be noted that the emitter 22h of the channel-collector transistor 20h has been bent in a U-shape within the base portion 21h, and that the heavily doped (p+) regions 21hl and 21h2 of the base region 21h surround the periphery of the emitter region 22h, to increase the current handling capabilities of the device without sacrificing area thereof.

As previously described with respect to the FIG. 8 channel-collector transistor 20e, the unique base configurations 21,e .and 21h minimize or "mask-out" any effects of "emitter-push" associated with the diffusion of the emitter 22h. Since the channel thickness of the intrinsic FET portion 42 of the device 20h is significantly less than that of the intervening FET 41, the additional current limiting effect of the intervening FET 41 caused by "emitter-push" will be negligible in the operation of the composite device. This configuration also allows for design of optimum base and emitter doping densities and thicknesses.

Figure 13:
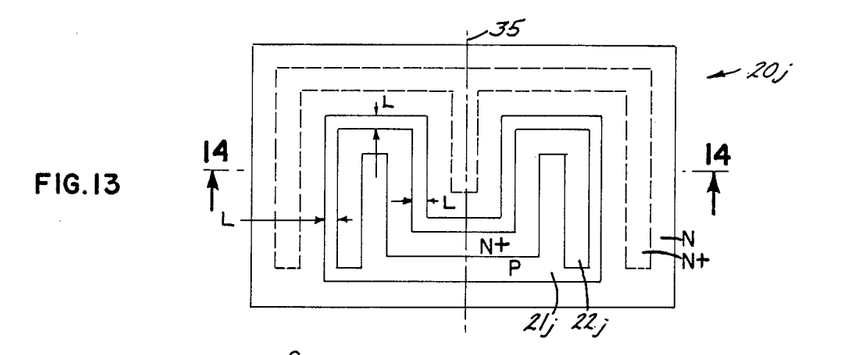
FIG. 13 is a diagrammatic illustration, in top plan, of a channel-collector transistor constructed according to the principles of this invention, illustrating a combined interdigitated collector-base and serpentine emitter configuration.
Figure 14:
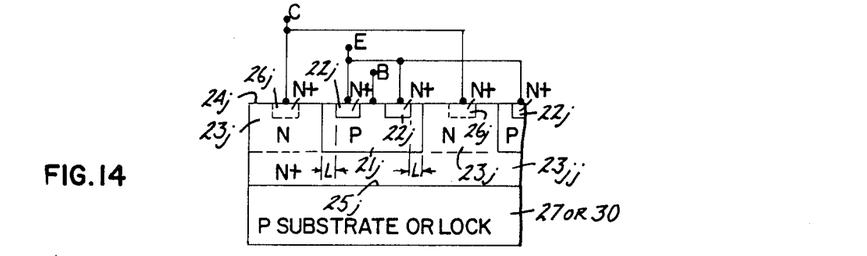
FIG. 14 is a diagrammatic illustration, in cross-section of a portion of the channel-collector transistor illustrated in FIG. 13, as generally viewed along the Line 14—14 of FIG. 13.

All of the channel-collector transistor 20a through 20h variations directly lend themselves to design into configurations which when viewed in plan view, have serpentine-like emitter 22 shapes and/or interdigitated collector 23 and base 21 regions respectively, to provide improved performance and current handling characteristics for the composite device. An example of such a device is illustrated in FIGS. 13 and 14. Referring thereto, there is illustrated a channel-collector transistor 20j which is symmetrically configured in top plan, about an axis of symmetry 35. Each of the halves of the device 20j includes a serpentine-shaped emitter 22j which is formed within the base region 21j in close proximity to the outer lateral border of the base region 21j so as to minimize the "L" dimension of the intrinsic FET 42 portions of the composite device. It will be appreciated from a review of FIG. 13, that the critical "L" dimension for the intrinsic FET 42 extends along the entire length of the serpentine emitter region, and that by extending the emitter region in such serpentine-like fashion, the active channel portion of the intrinsic FET 42 can be significantly increased. The particular cross sectional configuration of the channel-collector transistor 20j selected in FIG. 14 resembles that configuration for the 20f channel-collector transistor previously disclosed in FIG. 9, which employs the "J process". It will be recalled that use of the "J process" in the channel-collector transistor configuration eliminates the emitter-push layer deformation in the active channel region of the device, thus minimizing the current-limiting effect of the intervening FET portions 41 of the device.

Referring to FIGS. 13 and 14, it will be observed that the collector region 23j and the base region 21j have been "interdigitated". Besides providing higher current handling capability and improved operating performance characteristics, the combination of the interdigitated base and collector regions and the serpentine emitter configuration, makes the channel-collector transistor with these properties highly attractive for use within integrated circuit networks since all of the output terminals of the composite device (i.e. the collector region 26, the base region 21 and the emitter region 22) are accessible to integrated circuit metallization paths without requiring a cross-over of metallization paths (i.e. multi-layer metallization layers are not required) to gain electrical access to the respective output ports of the device. It will be appreciated that all of the device configurations illustrated in the Drawing can be incorporated in both the serpentine emitter and the interdigitated collector-base configurations, similar in manner to that illustrated in FIGS. 13 and 14.

Figure 17:
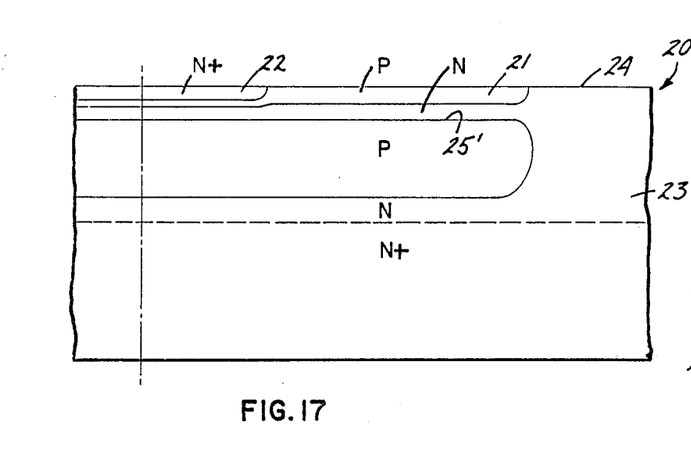
FIG. 17 is a diagrammatic illustration of a partial-section of the channel-collector transistor disclosed in FIG. 2, illustrating a more realistic scaled representation of the respective relative dimensions of the various layers and regions of the device.

Throughout the Drawing, the device geometries and relative dimensions of various layers and regions thereof have been grossly misproportioned in an effort to simplify definition of the various device configuration. A more accurate scaled diagram of a portion of that configuration of a channel-collector transistor 20 which is disclosed in FIG. 2 is illustrated in FIG. 17. A review of FIG. 17 for the relative dimensions and spacings of the respective layers and regions of the channel-collector transistor 20 will provide one with an appreciation of the "thinness" of the channel-collector area which provides the "merged" properties of the device. FIG. 17 also provides one with an appreciation for the effects of "emitter-push" on the collector-channel region thickness and with an awareness of the processing and design factors involved in decreasing the "L" dimension of the channel portion of either the intervening FET 41 or the intrinsic FET 42.

Other modification of the invention will be apparent to those skilled in the art in light of the foregoing description. This description is intended to provide concrete examples of individual embodiments clearly disclosing the present invention. Accordingly, the invention is not limited to any particular embodiment, and various combinations of the processes and topological configurations of the solid state electronics art are anticipated hereby. Alternatives, modifications and variations of the present invention which fall within the spirit and broad scope of the appended claims are covered.

What is claimed is:

1. An improved merged channel-collector transistor semiconductor device, comprising:
   (a) a body of semiconductor material defining an upper surface and characterized by:
     (i) a base region of a first conductivity type extending from said upper surface;
     (ii) a collector region of a second conductivity type opposite to that of said first conductivity type, forming an operative junction with said base region and defining an effective lower collector boundary of said collector region, which underlies and is spaced apart from said base region;
     (iii) an emitter region of said second conductivity type forming an operative junction with said base region, said emitter region lying within the lateral extent of said base region;
     (iv) that said collector region which is located below substantially the entire said base region and interposed between said base-collector junction and said effective lower collector boundary being sufficiently thin and having controlled impurity concentration therethrough so as to cause said interposed collector region to simultaneously operatively function as an active collector region of a bipolar junction transistor and a channel region of a junction field-effect transistor, wherein the equivalent circuit of said channel-collector sharing field-effect and bipolar junction transistors approximates a cascode configuration;
     (v) said emitter being configured such that at least one edge thereof, as viewed in top plan, lies in close proximity with a substantial portion of the periphery of said base region, for minimizing the lateral "L" dimension of that field-effect channel portion of said interposed collector region which comprises the outer peripheral portion thereof but which does not underlie said emitter region; and
     (vi) wherein said emitter region is configured with at least one bend in serpentine-shape as viewed in top plan, for increasing the "W" dimension of that field-effect channel portion of said interposed collector region which comprises the outer peripheral portion thereof, but which does not underlie said emitter region; and
   (b) means adjacent said effective lower collector boundary of said collector region for preventing majority carrier current flow from said collector region across said lower effective collector boundary.

2. An improved merged channel-collector transistor semiconductor device, comprising:
   (a) a body of semiconductor material defining an upper surface and characterized by:
     (i) a base region of a first conductivity type extending from said upper surface;
     (ii) a collector region of a second conductivity type opposite to that of said first conductivity type, forming an operative junction with said base region and defining an effective lower collector boundary of said collector region, which underlies and is spaced apart from said base region;
     (iii) an emitter region of said second conductivity type forming an operative junction with said base region, said emitter region lying within the lateral extent of said base region;

(iv) that said collector region which is located below substantially the entire said base region and interposed between said base-collector junction and said effective lower collector boundary being sufficiently thin and having controlled impurity concentration therethrough so as to cause said interposed collector region to simultaneously operatively function as an active collector region of a bipolar junction transistor and a channel region of a junction field-effect transistor, wherein the equivalent circuit of said channel-collector sharing field-effect and bipolar junction transistors approximates a cascode configuration;

(v) said emitter being configured such that at least one edge thereof, as viewed in top plan, lies in close proximity with a substantial portion of the periphery of said base region, for minimizing the lateral "L" dimension of that field-effect channel portion of said interposed collector region which comprises the outer peripheral portion thereof but which does not underlie said emitter region; and (vi) wherein said base and said collector regions are configured in interdigitated manner as viewed in top plan; and (b) means adjacent said effective lower collector boundary of said collector region for preventing majority carrier current flow from said collector region across said lower effective collector boundary.

3. An improved merged channel-collector transistor semiconductor device, comprising:

(a) a body of semiconductor material defining an upper surface and characterized by:

(i) a base region of a first conductivity type extending from said upper surface;

(ii) a collector region of a second conductivity type opposite to that of said first conductivity type, forming an operative junction with said base region and defining an effective lower collector boundary of said collector region, which underlies and is spaced apart from said base region;

(iii) an emitter region of said second conductivity type forming an operative junction with said base region, said emitter region lying within the lateral extent of said base region;

(iv) that said collector region which is located below substantially the entire said base region and interposed between said base-collector junction and said effective lower collector boundary being sufficiently thin and having controlled impurity concentration therethrough so as to cause said interposed collector region to simultaneously operatively function as an active collector region of a bipolar junction transistor and a channel region of a junction field-effect transistor, wherein the equivalent circuit of said channel-collector sharing field-effect and bipolar junction transistors approximates a cascode configuration;

(v) said emitter being configured such that at least one edge thereof, as viewed in top plan, lies in close proximity with a substantial portion of the periphery of said base region, for minimizing the lateral "L" dimension of that field-effect channel portion of said interposed collector region which comprises the outer peripheral portion thereof but which does not underlie said emitter region; and (vi) wherein as viewed in top plan, said base region is generally U-shaped, and wherein said collector region surrounds the periphery of said base region and has an inwardly directed projection formed in interdigitated manner within the open central portion of said U-shaped base region; and (b) means adjacent said effective lower collector boundary of said collector region for preventing majority carrier current flow from said collector region across said lower effective collector boundary.

4. An improved merged channel-collector transistor semiconductor device as recited in claim 3, wherein said emitter region is configured with at least one bend in serpentine-like manner in each leg of said U-shaped base region, and extends continuously therebetween.

5. An improved merged channel-collector transistor semiconductor device as recited in claim 4, wherein said base and emitter configurations are symmetrical in top plan about an axis of symmetry.

6. An improved merged channel-collector transistor semiconductor device, comprising:

(a) a body of semiconductor material defining an upper surface and characterized by:

(i) a base region of a first conductivity type extending from said upper surface;

(ii) a collector region of a second conductivity type opposite to that of said first conductivity type, forming an operative junction with said base region and defining an effective lower collector boundary of said collector region, which underlies and is spaced apart from said base region;

(iii) an emitter region of said second conductivity type forming an operative junction with said base region, said emitter region lying within the lateral extent of said base region;

(iv) that said collector region which is located below substantially the entire said base region and interposed between said base-collector junction and said effective lower collector boundary being sufficiently thin and having controlled impurity concentration therethrough so as to cause said interposed collector region to simultaneously operatively function as an active collector region of a bipolar junction transistor and a channel region of a junction field-effect transistor, wherein the equivalent circuit of said channel-collector sharing field-effect and bipolar junction transistors approximates a cascode configuration; said collector region being further characterized by a zone of relatively increased impurity concentration of said second conductivity-type extending in said interposed collector region between said effective lower collector boundary and said base region and having lateral extent at least that of said base region;

(v) said emitter being configured such that at least one edge thereof, as viewed in top plan, lies in close proximity with a substantial portion of the periphery of said base region, for minimizing the lateral "L" dimension of that field-effect channel portion of said interposed collector region which comprises the outer peripheral portion thereof but which does not underlie said emitter region; and (b) means adjacent said effective lower collector boundary of said collector region for preventing majority carrier current flow from said collector region across said lower effective collector boundary; wherein said means adjacent said effective lower collector boundary comprises a layer of said first conductivity-type material, having transverse extent at least that of said base region and forming a p-n junction with said collector region.

7. An improved merged channel-collector transistor semiconductor device, comprising:
 (a) a body of semiconductor material defining an upper surface and characterized by:
  (i) a base region of a first conductivity type extending from said upper surface;
  (ii) a collector region of a second conductivity type opposite to that of said first conductivity type, forming an operative junction with said base region and defining an effective lower collector boundary of said collector region, which underlies and is spaced apart from said base region;
  (iii) an emitter region of said second conductivity type forming an operative junction with said base region, said emitter region lying within the lateral extent of said base region;
  (iv) that said collector region which is located below substantially the entire said base region and interposed between said base-collector junction and said effective lower collector boundary being sufficiently thin and having controlled impurity concentration therethrough so as to cause said interposed collector region to simultaneously operatively function as an active collector region of a bipolar junction transistor and a channel region of a junction field-effect transistor, wherein the equivalent circuit of said channel-collector sharing field-effect and bipolar junction transistors approximates a cascode configuration; and
  (v) said emitter being configured such that at least one edge thereof, as viewed in top plan, lies in close proximity with a substantial portion of the periphery of said base region, for minimizing the lateral "L" dimension of that field-effect channel portion of said interposed collector region which comprises the outer peripheral portion thereof but which does not underlie said emitter region; and
 (b) means adjacent said effective lower collector boundary of said collector region for preventing majority carrier current flow from said collector region across said lower effective collector boundary, said means adjacent said effective lower collector boundary comprising a barrier layer of dielectrically isolating material.

8. An improved merged channel-collector transistor semiconductor device, comprising:
 (a) a body of semiconductor material defining an upper surface and characterized by:
  (i) a base region of a first conductivity type extending from said upper surface;
  (ii) a collector region of a second conductivity type opposite to that of said first conductivity type, forming an operative junction with said base region and defining an effective lower collector boundary of said collector region, which underlies and is spaced apart from said base region, said effective lower collector boundary further defining a lower surface of said semiconductor body;
  (iii) an emitter region of said second conductivity type forming an operative junction with said base region, said emitter region lying within the lateral extent of said base region;
  (iv) that said collector region which is located below substantially the entire said base region and interposed between said base-collector junction and said effective lower collector boundary being sufficiently thin and having controlled impurity concentration therethrough so as to cause said interposed collector region to simultaneously operatively function as an active collector region of a bipolar junction transistor and a channel region of a junction field-effect transistor, wherein the equivalent circuit of said channel-collector sharing field-effect and bipolar junction transistors approximates a cascode configuration;
  (v) said emitter being configured such that at least one edge thereof, as viewed in top plan, lies in close proximity with a substantial portion of the periphery of said base region, for minimizing the lateral "L" dimension of that field-effect channel portion of said interposed collector region which comprises the outer peripheral portion thereof but which does not underlie said emitter region; and
 (b) means adjacent said effective lower collector boundary of said collector region comprising an air-insulation layer, for preventing majority carrier current flow from said collector region across said lower effective collector boundary; and
 (c) means for maintaining said air-insulation layer below said effective collector boundary upon bonding of said semiconductor body to a foreign body.

9. An improved merged channel-collector transistor semiconductor device, comprising:
 (a) a body of semiconductor material defining an upper surface and characterized by:
  (i) a base region of a first conductivity type extending from said upper surface;
  (ii) a collector region of a second conductivity type opposite to that of said first conductivity type, forming an operative junction with said base region and defining an effective lower collector boundary of said collector region, which underlies and is spaced apart from said base region;
  (iii) an emitter region of said second conductivity type forming an operative junction with said base region, said emitter region lying within the lateral extent of said base region and formed in a generally U-shaped configuration; and wherein that portion of said base region which extends in tóp plan around the outer periphery of said emitter region and between said emitter region and the outer periphery of said base region, has a relatively increased impurity concentration of said first conductivity type and extends relatively deeper into said underlying collector region as compared respectively to like parameters of that portion of said base region which underlies substantially said emitter region;
  (iv) that said collector region which is located below substantially the entire said base region and interposed between said base-collector junction and said effective lower collector boundary being sufficiently thin and having controlled impurity concentration therethrough so as to cause said interposed collector region to simultaneously operatively function as an active collector region of a bipolar junction transistor and a channel region of a junction field-effect transistor, wherein the equivalent circuit of said channel-collector sharing field-effect and bipolar junction transistors approximates a cascode configuration; and (v) said emitter being configured such that at least one edge thereof, as viewed in top plan, lies in close proximity with a substantial portion of the periphery of said base region, for minimizing the lateral "L" dimension of that field-effect channel portion of said interposed collector region which comprises the outer peripheral portion thereof but which does not underlie said emitter region; and (b) means adjacent said effective lower collector boundary of said collector region for preventing carrier current flow from said collector region across said lower effective boundary.

10. An improved merged channel-collector transistor semiconductor device, comprising:

(a) a collector-providing layer of first conductivity type material having first and second oppositely disposed sides each respectively defining first and second surfaces; said first side containing a base region of second conductivity type opposite in conductivity to that of said first conductivity type and interdigitated, as viewed in top plan, with said collector layer; and an emitter region of said first conductivity type within said base region and shaped to conform with the interdigitated shape of said base region, said collector layer and said base and emitter regions each having a portion thereof exposed at said first surface of said device; said base region being characterized by a first base region underlying at least said emitter region, and a peripheral base region continuous with and skirting or surrounding said first base region and interposed in top plan between said emitter region and said collector region, said peripheral base region being of significantly greater depth as compared with similar parameters of said first base region; said layer having an active collector region located between said base region and said second surface, wherein that portion of said second surface substantially underlying said base region comprises an effective lower boundary of said active collector region;

(b) means for merging an operative channel portion of a field-effect transistor with at least a portion of said active collector region to form an integrally merged bipolar junction transistor and field-effect transistor device connected in cascode configuration; and (c) substrate means underlying said second surface of said layer for preventing majority carrier current flow from said collector region across said effective lower boundary portion thereof.

11. An improved merged channel-collector transistor semiconductor device, comprising a body of semiconductor material having first and second surfaces and characterized by:

(a) a collector-providing region of first conductivity-type extending from said second surface;

(b) a base region of second conductivity-type opposite to that of said first conductivity-type, forming an operative p-n junction with said collector region, that portion of said collector region located between said base-collector junction and said second surface and underlying substantially the entire base region, defining an active collector region having a thickness measured between said base-collector junction and said second surface;

(c) an emitter region of said first conductivity-type extending from said first surface and forming an operative p-n junction with said base region, said emitter region being of transverse extent no greater than that of said base region, that portion of said base region located between said emitter-base junction and said collector-base junction and underlying substantially the entire emitter region, defining an active base region having a thickness measured between said emitter-base and said collector-base junctions, the integral of the net impurity concentration of the active base region as taken through said thickness of said active base region being less than $2 \cdot 10^{12} \text{cm}^{-2}$; said emitter being configured such that at least one edge thereof, as viewed in top plan lies in close proximity with a substantial portion of the periphery of said base region, for minimizing the later "L" dimension of that portion of said device collector region which comprises the outer peripheral portion thereof but which does not underlie said emitter region;

(d) said active collector region being characterized by a first active collector region substantially underlying said active base region and a second active collector region comprising the remainder of said active collector region, the integral of the net impurity concentration of said first active collector region as taken through said thickness of said active collector region being greater than $10^{11} \text{cm}^{-2}$, and the integral of the net impurity concentration of said second active collector region as taken through said thickness of said active collector region lying in the range of $10^{11} \text{cm}^{-2}$ to $2 \times 10^{12} \text{cm}^{-2}$, whereby said active collector region operatively functions simultaneously as a collector of a bipolar junction transistor and a channel of a field-effect transistor, providing a semiconductor device having merged channel-collector transistor properties which approximates a cascode connected equivalent circuit configuration; and (e) wherein said emitter region is configured with at least one bend in serpentine-shape as viewed in top plan, for increasing the "W" dimension of that field-effect channel portion of said active collector region which comprises the outer peripheral portion thereof, but which does not underlie said emitter region.

12. A semiconductor device, comprising:

(a) a body of semiconductor material defining an upper surface and characterized by:

(i) a base region of a first conductivity type extending from said upper surface;

(ii) an emitter region of a second conductivity type opposite to that of said first conductivity type and forming a junction with said base region, said emitter region having a transverse extent in the direction generally parallel to said upper surface no greater than that of said base region;
(iii) a collector region of said second conductivity type forming a junction with said base region and defining an effective lower collector boundary of said collector region, underlying and spaced from said base region; and said collector region is further characterized by a zone of relatively increased impurity concentration of said second conductivity-type, extending in said channel-collector region between said effective lower collector boundary and said base region and having lateral extent at least that of said base region; substantially the entire base region and above said effective lower collector boundary comprising a merged collector region and being sufficiently thin and having impurity concentration controlled therethrough such that said merged collector region operatively functions simultaneously as an active collector region of a bipolar junction transistor and as channel regions of an intervening and an intrinsic junction field-effect transistors; said channel regions being further characterized by said intervening field-effect transistor channel region comprising at least that portion of said collector region located directly below said emitter region and defined by a control number (N2) of greater than $10^{11}cm^{-2}$, and said intrinsic field-effect transistor channel region comprising the remaining portion of said merged collector region that is located below said base region but outside of said intervening field effect transistor channel region and defined by a control number (N3) lying in the range of about $10^{11}cm^{-2}$ to $2\times10^{12}cm^{-2}$;
(b) means adjacent said effective lower collector boundary of said collector region comprising a substrate layer of said first conductivity material, having transverse extent in the direction generally parallel to said upper surface at least that of said base region for preventing majority carrier current flow across said effective lower collector boundary when said device is operatively biased and forming a p-n junction with said collector region; and
(c) means for increasing the current carrying capability of the semiconductor device, comprising means for increasing the current carrying capability of said intervening field-effect transistor channel region, thereby neutralizing its otherwise parasitic current limiting effect on the operation of the semiconductor device.

13. A semiconductor device, comprising:
(a) a body of semiconductor material defining an upper surface and characterized by:
(i) a base region of a first conductivity type extending from said upper surface;
(ii) an emitter region of a second conductivity type opposite to that of said first conductivity type and forming a junction with said base region, said emitter region having a transverse extent in the direction generally parallel to said upper surface no greater than that of said base region;
(iii) a collector region of said second conductivity type forming a junction with said base region and defining an effective lower collector boundary of said collector region, underlying and spaced from said base region;
(iv) that portion of said collector region located below substantially the entire base region and above said effective lower collector boundary comprising a merged collector region and being sufficiently thin and having impurity concentration controlled therethrough such that said merged collector region operatively functions simultaneously as an active collector region of a bipolar junction transistor and as channel regions of an intervening and an intrinsic junction field-effect transistors; said channel regions being further characterized by said intervening field-effect transistor channel region comprising at least that portion of said collector region located directly below said emitter region and defined by a control number (N2) of greater than $10^{11}cm^{-2}$, and said intrinsic field-effect transistor channel region comprising the remaining portion of said merged collector region that is located below said base region but outside of said intervening field effect transistor channel region and defined by a control number (N3) lying in the range of about $10^{11}cm^{-2}$ to $2\times10^{12}cm^{-2}$;
(b) means adjacent said effective lower collector boundary of said collector region and having a transverse extent at least that of said base region for preventing majority carrier current flow across said effective lower collector boundary when said device is operatively biased; said means adjacent said effective lower collector boundary comprising a barrier layer of dielectrically isolating material; and
(c) means for increasing the current carrying capability of the semiconductor device, comprising means for increasing the current carrying capability of said intervening field-effect transistor channel region thereby neutralizing its otherwise parasitic current limiting effect on the operation of the semiconductor device.

14. A semiconductor device as recited in claim 13, wherein said barrier layer extends to said upper surface and surrounds in moat-like manner said collector, base, and emitter regions.

15. A semiconductor device as recited in claim 13, wherein said dielectrically isolating barrier comprises a layer of silicon dioxide overlying a supportive layer of polycrystalline silicon material.

16. A semiconductor device, comprising:
(a) a body of semiconductor material defining an upper surface and characterized by:
(i) a base region of a first conductivity type extending from said upper surface;
(ii) an emitter region of a second conductivity type opposite to that of said first conductivity type and forming a junction with said base region, said emitter region having a transverse extent in the direction generally parallel to said upper surface no greater than that of said base region;
(iii) a collector region of said second conductivity type forming a junction with said base region and defining an effective lower collector boundary of said collector region, underlying and spaced from said base region; said effective lower collector boundary further defining a lower surface of said semicondcutor body;
(iv) that portion of said collector region located below substantially the entire base region and above said effective lower collector boundary comprising a merged collector region and being sufficiently thin and having impurity concentration controlled therethrough such that said merged collector region operatively functions simultaneously as an active collector region of a bipolar junction transistor and as channel regions of an intervening and an intrinsic junction field-effect transistors; said channel regions being further characterized by said intervening field-effect transistor channel region comprising at least that portion of said collector region located directly below said emitter region and defined by a control number (N2) of greater than $10^{11} cm^{-2}$, and said intrinsic field-effect transistor channel region comprising the remaining portion of said merged collector region that is located below said base region but outside of said intervening field effect transistor channel region and defined by a control number (N3) lying in the range of about $10^{11} cm^{-2}$ to $2 \times 10^{12} cm^{-2}$;

(b) means adjacent said effective lower collector boundary of said collector region comprising an air-insulation layer and having a transverse extent at least that of said base region for preventing majority carrier current flow across said effective lower collector boundary when said device is operatively biased;

(c) means for increasing the current carrying capability of the semiconductor device, comprising means for increasing the current carrying capability of said intervening field-effect transistor channel region thereby neutralizing its otherwise parasitic current limiting effect on the operation of the semiconductor device; and (d) means for maintaining said air-insulation layer below said effective lower collector boundary upon bonding of said semiconductor body to a foreign body.

* * * * *